United States Patent
Mirmak

(10) Patent No.: US 8,847,651 B1
(45) Date of Patent: Sep. 30, 2014

(54) APPARATUS, METHOD AND SYSTEM FOR IMPLEMENTING A HARDWARE INTERFACE PINOUT

(71) Applicant: Michael D. Mirmak, Folsom, CA (US)

(72) Inventor: Michael D. Mirmak, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/844,305

(22) Filed: Mar. 15, 2013

(51) Int. Cl.
*H03H 11/26* (2006.01)

(52) U.S. Cl.
CPC .................................. *H04L 27/0203* (2013.01)
USPC .............................. 327/276; 327/269; 327/272

(58) Field of Classification Search
USPC .......................................... 327/269, 272, 276
See application file for complete search history.

(56) References Cited

U.S. PATENT DOCUMENTS

2003/0160645 A1* 8/2003 Eto et al. ..................... 327/276

OTHER PUBLICATIONS

"Mastering High Performance Multiprocessor Signaling: Electrical Design with the Intel® QuickPath Interconnect by Dave Coleman and Michael Mirmak; Intel Press, 2010; ISBN 13: 978-1-934053-16-4;", (2010), Chapter 5, pp. 165-167 and pp. 168-169.

* cited by examiner

*Primary Examiner* — John Poos
(74) *Attorney, Agent, or Firm* — Blakely, Sokoloff, Taylor & Zafman LLP

(57) ABSTRACT

Techniques and mechanisms for operating an integrated circuit to communicate via a hardware interface for the integrated circuit, wherein a pinout with the hardware interface is based on the configuration. In an embodiment, the integrated circuit receives a first plurality of signals via the hardware interface, and sequentially latches a second plurality of signals based on the first plurality of signals. In another embodiment, some or all of the second plurality of signals are variously latched by the integrated circuit in an order which is based on the first configuration.

23 Claims, 8 Drawing Sheets

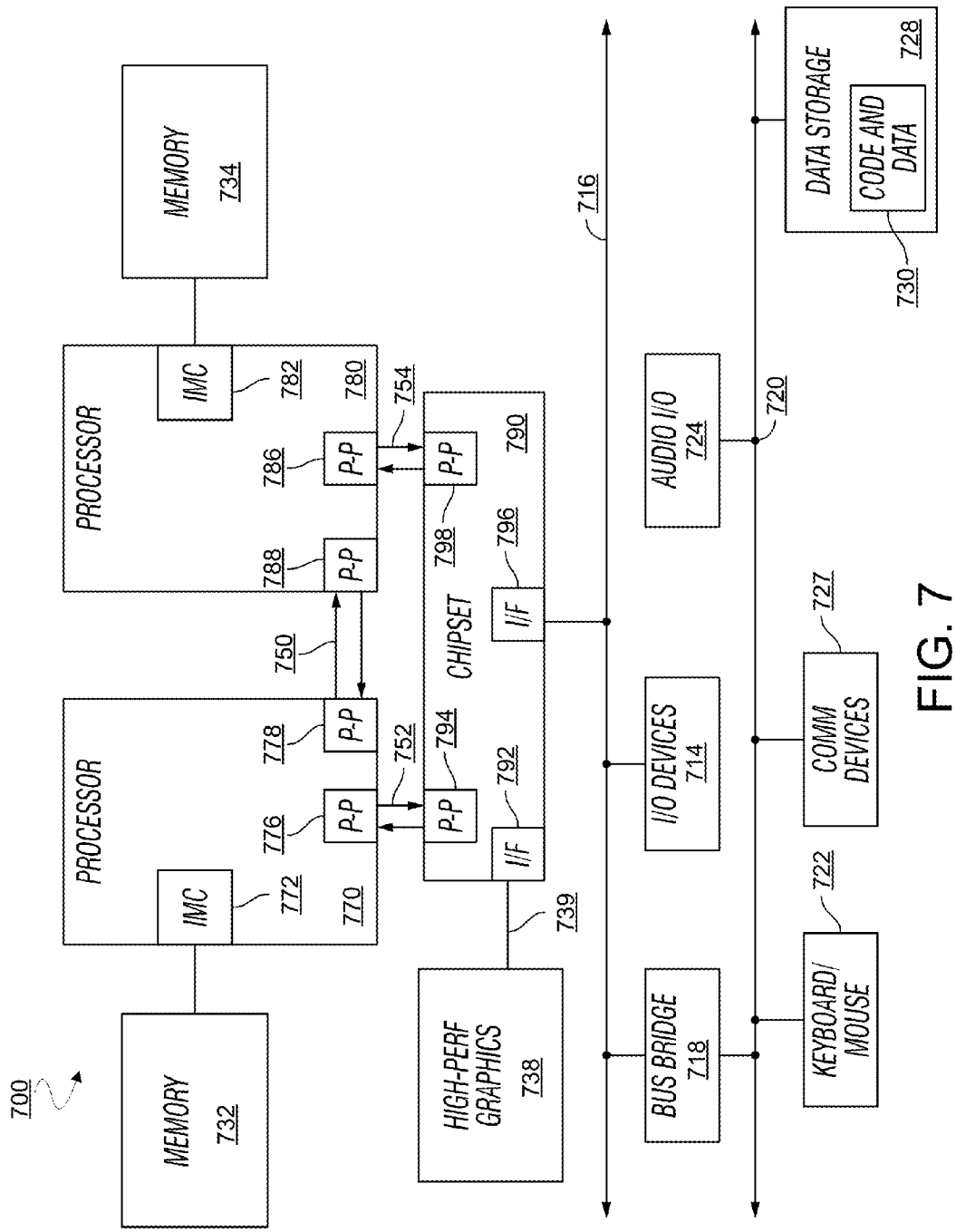

APPARATUS, METHOD AND SYSTEM FOR IMPLEMENTING A HARDWARE INTERFACE PINOUT

BACKGROUND

1. Technical Field

Embodiments described herein generally relate to integrated circuit devices and more particularly, but not exclusively, to communication between integrated circuit devices.

2. Background Art

Current multi-lane interface standards provide only limited options for physically connecting devices. Typically, printed circuit board routing is constrained by an interface standard specifying that transmitter device outputs are each to be coupled only to a specific corresponding input of a receiver device. Consequently, circuit board designers and layout engineers are limited as to how transmitting and receiving devices are to be placed with respect to one another.

Some limited layout flexibility is provided by interface technology which supports polarity inversion and/or lane reversal. Polarity inversion enables the positive and negative signals of a differential pair to be switched with one another. Lane reversal allows an interface to be connected as a whole to some device in either of two opposite orientations (for example, so that a line of N pins 0, 1, 2, . . . , (N−1) of an interface can instead be coupled to operate, respectively, as pins (N−1), . . . , 2, 1, 0). However, polarity inversion and lane reversal only slightly improve the routing options available to board designers.

BRIEF DESCRIPTION OF THE DRAWINGS

The various embodiments of the present invention are illustrated by way of example, and not by way of limitation, in the figures of the accompanying drawings and in which:

FIG. 7 is a block diagram illustrating elements of a computer platform to configure a pinout for a hardware interface according to an embodiment.

DETAILED DESCRIPTION

Embodiments discussed herein variously provide a pinout with a hardware interface, the pinout for signal exchanges between a transmitter device and a receiver device. As used herein with respect to a hardware interface, the term "pinout" refers to a correspondence of electrical contacts of the hardware interface each with a respective signal to be exchanged by that electrical contact. The receiver device may include circuitry which is configurable to provide, for example, a particular order of latching operations to be performed for signals received via the hardware interface.

The configurable architecture of such a receiver device offers a number of advantages over current architectures—e.g. including an increased flexibility in board trace routing. For example, board design engineers may take advantage of shortest paths between a transmitter device and a receiver device, rather than having to adjust trace routing to accommodate device pinouts. Similarly, the placement of devices relative to one another may be less constrained. Alternatively or in addition, devices may be configured to provide pinouts with improved signaling characteristics—e.g. including reduced crosstalk—without one or more spatial constraints which might otherwise exist due to required pin matching between a transmitter device and a receiver device. Alternatively or in addition, IC package design engineers may take advantage of such a configurable architecture for improved routing of IC package connections to package die bumps—e.g. for improved space utilization and/or signaling behavior.

Figure 1:
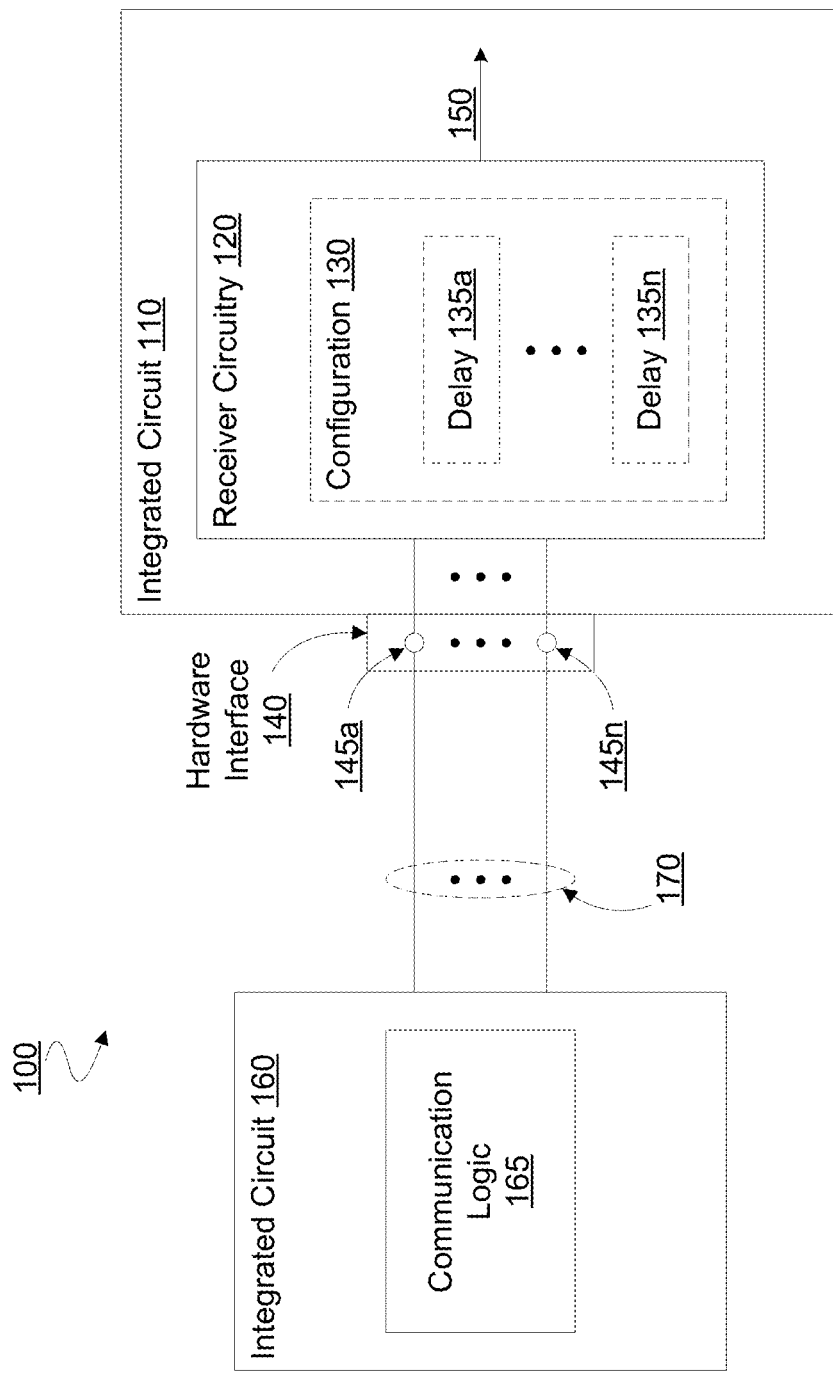
FIG. 1 is a block diagram illustrating elements of a system for configuring a hardware interface pinout according to an embodiment.

FIG. 1 illustrates elements of a system 100 for implementing signal communications according an embodiment. System 100 may, for example, include a hardware platform of a personal computer such as a desktop computer, laptop computer, a handheld computer—e.g. a tablet, palmtop, smart phone, media player, and/or the like—and/or other such computer system. Alternatively or in addition, system 100 may provide for operation as a server, workstation, or other such computer system.

In an embodiment, system 100 includes an integrated circuit (IC) 110 and one or more other integrated circuits—represented by an illustrative IC 160—coupled to IC 110 via a hardware interface 140 for IC 110. Hardware interface 140 may be located on the same silicon substrate as that of IC 110. Alternatively, IC 110 may be incorporated into a package, where hardware interface 140 is an interface for the package. For the purpose of illustrating certain features of various embodiments, system 100 is discussed herein with respect to techniques and mechanisms for IC 110 to exchange communications with a single IC 160. However, such techniques and mechanisms may be adapted for IC 110 to exchange communications with any of a variety of one or more additional or alternative integrated circuits, according to different embodiments.

IC 110 and IC 160 may be coupled to one another, for example, by a printed circuit board (not shown) of system 100. By way of illustration and not limitation, IC 110 and hardware interface 140 may both be part of a package which is coupled to such a printed circuit board via hardware interface 140. Alternatively, IC 110 and IC 160 may be incorporated into the same package—e.g. where the package includes a die stack and IC 110 and IC 160 are disposed in different respective dies of the die stack.

In an embodiment, IC 110 includes receiver circuitry 120 to receive for IC 110 signals which IC 160 communicates via hardware interface 140. Receiver circuitry 120 may variously latch such signals for generating corresponding bits 150 of information for subsequent processing—e.g. by other logic (not shown) included in or coupled to IC 110. For example, in addition to receiver circuitry 120, IC 110 may include processor logic, controller logic, memory and/or any of a variety of additional or alternative circuit logic (not shown) for operating on bits 150. Certain embodiments are not limited with respect to the particular functionality of such other logic for operating on bits 150.

Additionally or alternatively, IC 160 may include communication logic 165 to variously send signals to hardware interface 165. In addition to communication logic 165, IC 160 may include processor logic, controller logic, memory and/or any of a variety of additional or alternative circuit logic (not shown) for operating on data to generate such signals. Certain embodiments are not limited with respect to the particular functionality of such other logic of IC 160.

In an embodiment, receiver circuitry 120 may be transitioned to a configuration 130 for providing a particular pinout—e.g. one of a plurality of possible pinouts—with hardware interface 140. The "pinout" of a hardware interface refers to the correspondence of electrical contacts of that hardware interface each with a respective signal to be exchanged by that electrical contact. A pinout may define the associated signal communication functionality for each of a plurality of contacts 145a, ..., 145n of hardware interface 140. In an embodiment, contacts 145a, ..., 145n include pins, pads, balls, and/or any of a variety of other electrical contact structures (male or female).

Configuration 130 may be set during one of a variety of stages of manufacturing to create system 100 and/or one of a variety of stages during operation of system 100. For example, configuration 130 may be set after final packaging of IC 110—e.g. where configuration 130 is set after a package including IC 110 is coupled to IC 160 via a printed circuit board of system 100. In an embodiment, configuration 130 is set in response to IC 110 receiving an indication of functionality of IC 160.

For example, IC 160 may be arranged in system 100 for, and/or communication logic 165 may be configured for, different types of signals to be variously sent from IC 160 each via a respective one of signal lines 170. Prior to receiver circuitry 120 transitioning to configuration 130, IC 110 may exchange with control logic (not shown)—e.g. included in or coupled to IC 160—communications which indicate the correspondence of different signal types each with a respective one of signal lines 170.

Based on such communications, receiver circuitry 120 may identify configuration 130—e.g. including selecting configuration 130 from among a plurality of possible configurations of receiver circuitry 120. Receiver circuitry 130 may transition to configuration 130 to implement a pinout with hardware interface 140 which complements the indicated correspondence of different signal types each with a respective one of signal lines 170. In an embodiment, configuration 130 may provide for receiver circuitry 120 to implement a plurality of delays 135a, ..., 135n which each correspond to a respective one of contacts 145a, ..., 145b. For example, delays 135a, ..., 135n may determine an order of the bits 150 to be output from receiver circuitry 120.

Figure 2:
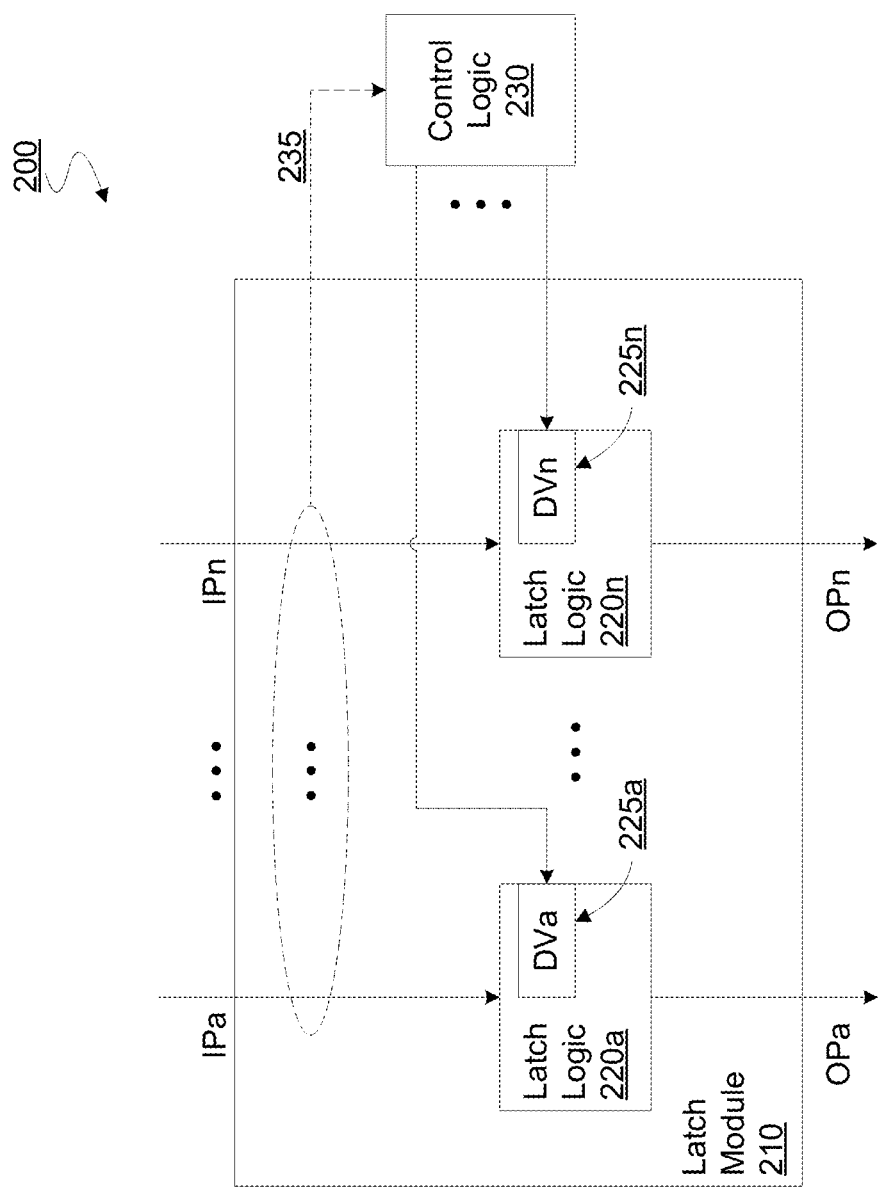
FIG. 2 is a block diagram illustrating elements of receiver circuitry of an integrated circuit according to an embodiment.

FIG. 2 illustrates elements of receiver circuitry 200 for receiving signals according to an embodiment. Receiver circuitry 200 may be part of an integrated circuit including one or more of the features of IC 110. For example, receiver circuitry 200 may provide some or all of the functionality of receiver circuitry 120.

In an embodiment, receiver circuitry 200 includes a latch module 210 to receive input signals IPa, ..., IPn and to variously latch output signals OPa, ..., OPn from latch module 210 based, respectively, on IPa, ..., IPn. IPa, ..., IPn may be received in parallel and/or concurrently by latch module 210—e.g. where IPa, ..., IPn are received by receiver circuitry 200 each from a different respective contact of a hardware interface (not shown) for receiver circuitry 200. By way of illustration and not limitation, IPa, ..., IPn may each be received via a different respective one of contacts 145a, ..., 145n.

In an embodiment, latch module 210 is transitioned at some point to a configuration which is to determine an order and/or timing of how OPa, ..., OPn are each to be latched as an output from latch module 210. For example, latch module 210 may include latch logic 220a, ..., 220n to receive IPa, ..., IPn, respectively. Such a configuration of receiver circuitry 200 may include a respective component configuration for each of latch logic 220a, ..., 220n. Each such component configuration may determine, at least in part, when the respective one of latch logic 220a, ..., 220n is to perform a latching to output the corresponding one of OPa, ..., OPn.

Latch logic 220a, ..., 220n may include or be coupled to delay circuitry which is configurable to define respective delays for various latch operations by latch logic 220a, ..., 220n. By way of illustration and not limitation, latch logic 220a, ..., 220n may include respective delay circuits 225a, ..., 225n. In an illustrative embodiment, delay circuits 225a may include a register or other logic to be configured to indicate a delay DVa for one or more latch operations of latch logic 220a. Alternatively or in addition, delay circuits 225n may include a register or other logic to be configured to indicate a delay DVn for one or more latch operations of latch logic 220n. Latch logic 220a, ..., 220n may be configured for any of a variety of additional or alternative delay values, according to different embodiments.

With configurable delay circuits 225a, ..., 225n, receiver circuitry 200 may not be limited with respect to how different types of signals are each received as a respective one of IPa, ..., IPn. For example, IPa, ..., IPn may variously represent bits for different types of data, address or command information, bits of different bit significance, and/or the like. Regardless of how IPa, ..., IPn variously represent such different respective bits—e.g. regardless of how the different signal types are each associated with a particular one of IPa, ..., IPn—receiver circuitry 200 may be configured for DVa, ..., DVn to provide the same ordering of bits to be output from latch module 210. Consequently, receiver circuitry 200 may be configured for a particular correspondence of IPa, ..., IPn each with a respective signal type. In turn, receiver circuitry 200 may be configured for implementing a particular pinout—e.g. one of a plurality of possible pinouts—with a hardware interface (not shown) which is to provide IPa, ..., IPn to receiver circuitry 200.

In an embodiment, receiver circuitry 200 is to undergo training to determine a pinout to be implemented. For example, such training may be for receiver circuitry 200 to determine a latching sequence which corresponds to the particular association of signal types each with a respective one of IPa, ..., IPn. Based on such a training sequence, latch module 210 may be configured to provide the latching sequence for implementing the determined hardware interface pinout. By way of illustration and not limitation, receiver circuitry 200 may include or otherwise be coupled to control logic 230 which is to provide one or more control signals to configure delay circuits 225a, ..., 225n for respective delays DVa, ..., DVn. Control logic 230 may determine DVa, ..., DVn based on communications with a transmitter device (not shown)—e.g. IC 160—which is to send signals IPa, ..., IPn to receiver circuitry 200 via a hardware interface.

In an embodiment, control logic 230 may receive or otherwise detect a pinout identifier value which specifies—e.g. according to some pre-determined protocol—a pinout to be implemented with the hardware interface. Based on the identifier value, control logic 235 may generate one or more control signals to variously configure delay circuits 225a, ..., 225n for respective delays DVa, ..., DVn.

In another embodiment, training of receiver circuitry 200 may include control logic 230 initializing some reference counter (not shown) and initiating a count sequence with the reference counter. During the count sequence, a transmitting device—e.g. IC 160—may send training signals each to a different respective contact of the hardware interface (not shown) for receiver circuitry 200. Control logic 230 may know in advance that the training signals are sent in an order which is to indicate a pinout in a particular sequence—e.g. from lowest pin number to highest pin number. Control logic 230 may perform a monitoring 235 of the order in which such training signals are provided to receiver circuitry 200. Based on the monitoring 235, control logic 230 may identify or otherwise indicate an order of the hardware interface contacts—e.g. including identifying a counter value for each respective time when a training signal is detected. With the identified counter values, control logic 235 may generate one or more control signals to variously configure delay circuits 225*a*, . . . , 225*n* for respective delays DVa, . . . , DVn. As can be seen, delays DVa, . . . , DVn may ensure a correct order of latched bits, no matter how such bits may each be represented by a respective one of inputs IPa, . . . , IPn. Delays DVa, . . . , DVn may be configured, for example, to provide latching which replicates the order in which the training signals are received, although certain embodiments are not limited in this regard. In an embodiment, delays DVa, . . . , DVn are variously based on an interface unit interval, clock cycle, or other baseline time interval for the timing needs of the integrated circuit which includes receiver circuitry 200.

Figure 3A:
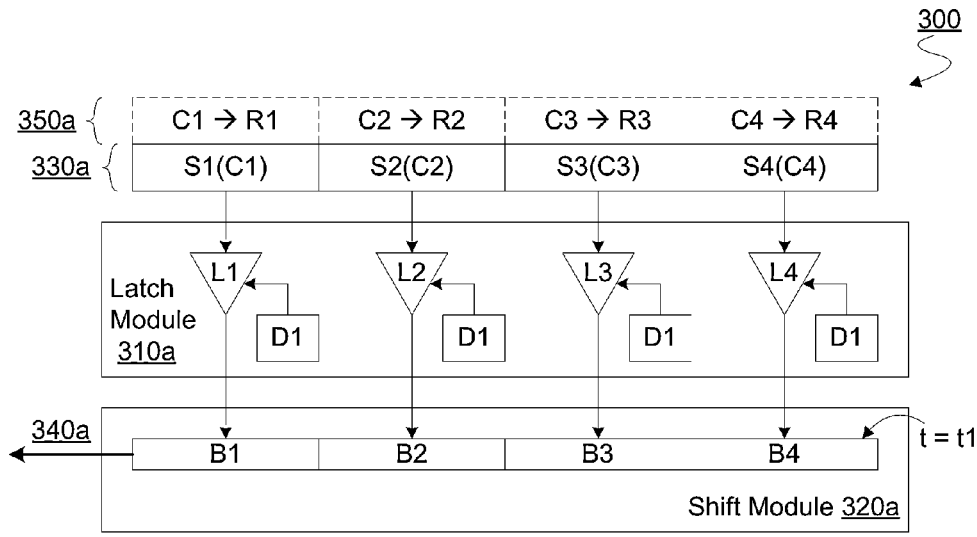
FIGS. 3A through 3D are block diagrams illustrating elements of various receiver circuitry each according to a respective embodiment.

FIG. 3A illustrates elements of receiver circuitry 300 according to an embodiment for receiving signals for an integrated circuit. Receiver circuitry 300 may be part of an integrated circuit including one or more of the features of IC 110. For example, receiver circuitry 300 may provide some or all of the functionality of receiver circuitry 200.

In an embodiment, receiver circuitry 300 includes a latch module 310*a* and a shift module 320*a* coupled to receive from latch module 310*a* bits B1, B2, B3, B4 based on S1, S2, S3, S4, respectively. Latch module 310*a* may include some or all of the features of latch module 210, for example. Latch module 310*a* may include some plurality of latches—represented by the illustrative latches L1, L2, L3, L4—where inputs 330*a* for latch module 310*a* provide respective signals S1, S2, S3, S4 to such latches. Based on signals S1, S2, S3, S4, latches L1, L2, L3, L4 variously perform latching for shift module 320*a* to receive latch bits B1, B2, B3, B4, respectively.

Receiver circuitry 300 may be coupled to a hardware interface (not shown) which includes multiple contacts, represented by the illustrative contacts C1, C2, C3, C4. In an embodiment, a configuration of receiver circuitry 300 may be set to implement a particular pinout with the hardware interface. By way of illustration and not limitation, receiver circuitry 300 may be configured to implement a pinout 350*a* in which contact C1 is to serve functionally as a logical input R1, contact C2 is to serve functionally as a logical input R2, contact C3 is to serve functionally as a logical input R3, and contact C4 is to serve functionally as a logical input R4. For example, logical inputs R1, R2, R3, R4 may be for receiving bits of different respective types of data, address or command information. Alternatively or in addition, the sequence R1, R2, R3, R4 may be for bits of successively increasing (or alternatively, decreasing) bit significance.

In an embodiment, S1, S2, S3, S4 are received in parallel and/or concurrently by latch module 310*a*—e.g. during the same cycle of a clock signal which synchronizes operation of receiver circuitry 300. To facilitate implementation of pinout 350*a*, latch module 310*a* may be configured for latches L1, L2, L3, L4 to variously perform latching based on one or more configured delay settings. By way of illustration and not limitation, latches L1, L2, L3, L4 may each be configured to latch at substantially the same time based on the same delay D1 (or, alternatively, no delay). In such an embodiment, shift module 320*a* may be loaded with the sequence of bits B1, B2, B3, B4 at a time t1 by virtue of latches L1, L2, L3, L4 each being coupled to output to a different storage cell in a sequence of storage cells of shift module 320*a*.

Based on the latch delay settings of latch module 310*a*—and, in an embodiment, on the arrangement of latches L1, L2, L3, L4, each with respect to corresponding cell of shift module 320*a*—shift module 320*a* may shift an output 340*a* which includes the sequence of bits B1, B2, B3, B4. For example, output 340*a* may be shifted to deserializer (DS) logic (not shown) which is included in or coupled to receiver circuit 300, where receipt of the sequence of bits B1, B2, B3, B4 by such DS logic is consistent with implementing pinout 350*a*.

Figure 3B:
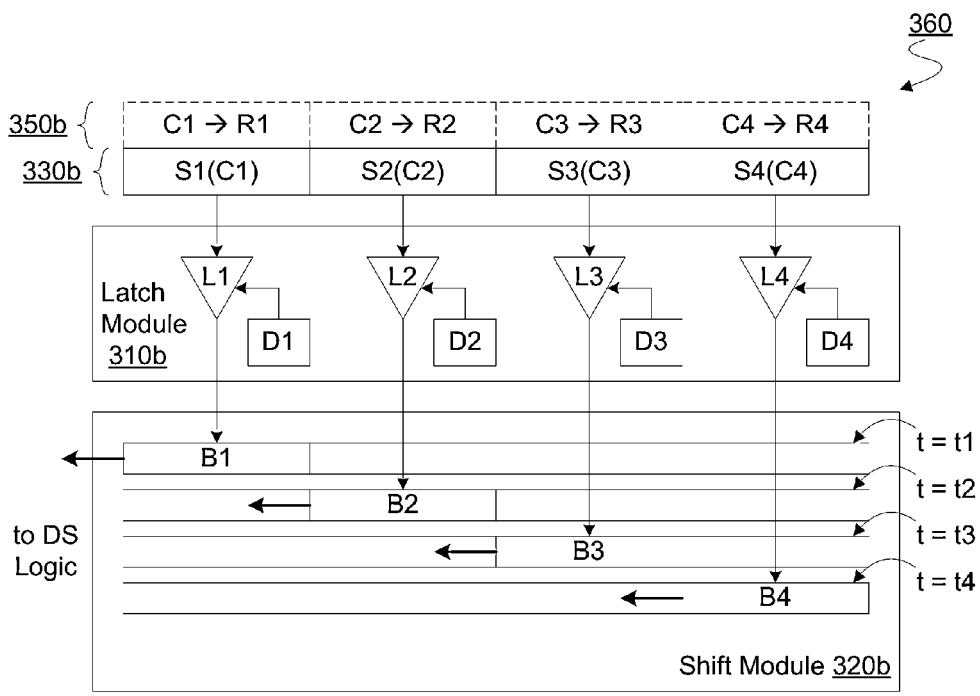

FIG. 3B illustrates elements of receiver circuitry 360 according to an embodiment for receiving signals for an integrated circuit. Receiver circuitry 360 may be part of an integrated circuit including one or more of the features of IC 110. For example, receiver circuitry 360 may represent a different configuration of receiver circuitry 300, although certain embodiments are not limited in this regard.

For the purpose of illustrating features of certain embodiments, receiver circuitry 360, receiver circuitry 370 (FIG. 3C) and receiver circuitry 380 (FIG. 3D) are variously discussed herein with respect to the same signals S1, S2, S3, S4 received by receiver circuitry 300, the same hardware interface contacts C1, C2, C3, C4 coupled to receiver circuitry 300 and the same bits B1, B2, B3, B4 which are based on signals S1, S2, S3, S4, respectively. However, it is understood that such discussion may be extended to apply to any of a variety of additional or alternative input signals, hardware interface contacts, and output bits for operation of receiver circuitry 360, 370 and/or 380.

In an embodiment, receiver circuitry 360 includes a latch module 310*b* and a shift module 320*b* coupled to receive bits B1, B2, B3, B4 variously latched from latch module 310*b*. Latch module 310*b* may include some plurality of latches—e.g. including the illustrative latches L1, L2, L3, L4—where inputs 330*b* for latch module 310*b* provide respective signals—e.g. signals S1, S2, S3, S4- to such latches. Based on signals S1, S2, S3, S4, latches L1, L2, L3, L4 may variously latch bits B1, B2, B3, B4, respectively, to shift module 320*b*.

Receiver circuitry 360 may be configured to implement a pinout 350*b* in which contact C1 is to serve functionally as logical input R1, contact C2 is to serve functionally as logical input R2, contact C3 is to serve functionally as logical input R3, and contact C4 is to serve functionally as logical input R4. In an embodiment, S1, S2, S3, S4 are received in parallel and/or concurrently by latch module 310*b* during such configuration—e.g. during the same cycle of a clock signal which synchronizes operation of receiver circuitry 360. To facilitate implementation of pinout 350*b*, latch module 310*b* may be configured for latches L1, L2, L3, L4 to variously perform latching based on respective delays D1, D2, D3, D4. By way of illustration and not limitation, L1 may be configured with delay D1 to latch bit B1 at time t1. Alternatively or in addition, L2 may be configured with delay D2 to latch bit B2 at time t2, L3 may be configured with delay D3 to latch bit B3 at time t3, and/or L4 may be configured with delay D4 to latch bit B4 at time t4.

In one embodiment, bits B1, B2, B3, B4 are successively latched into, and successively shifted from, the same single bit storage cell of shift module 320*b*. In another embodiment, some or all of bits B1, B2, B3, B4 are latched into different respective bit storage cells of shift module 320*b*—e.g. where multiple bits are all latched from latch module 310b into shift module 320b before any of the multiple bits are shifted out of shift module 320b. Based at least in part on the respective delays D1, D2, D3, D4 configured for latches L1, L2, L3, L4, shift module 320b may sequentially shift out bits B1, B2, B3, B4 in that order. For example, bits B1, B2, B3, B4 may be successively shifted to DS logic (not shown) for operation on bits B1, B2, B3, B4 in a bit order which is consistent with implementing pinout 350b.

Figure 3C:
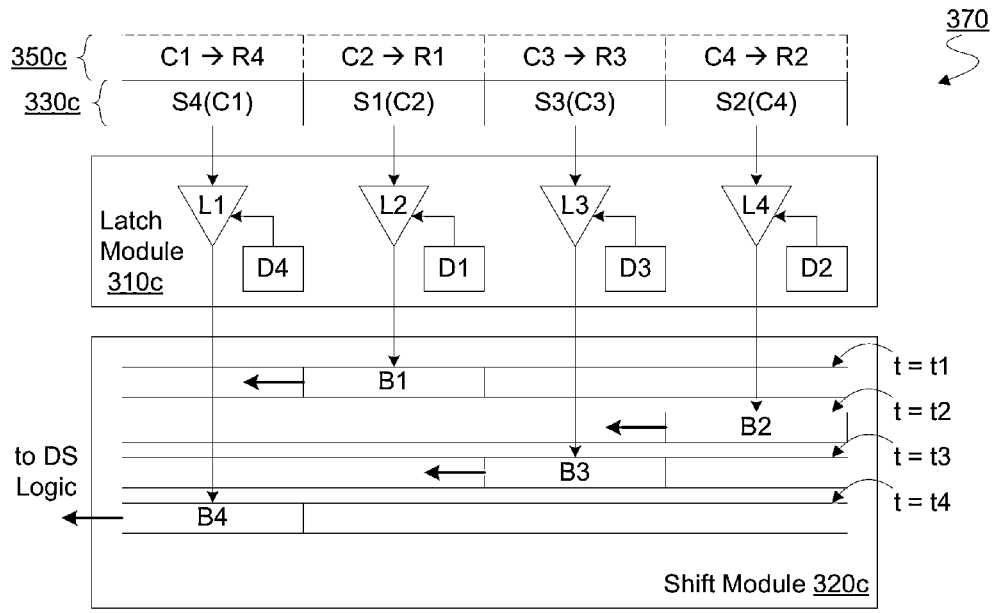

FIG. 3C illustrates elements of receiver circuitry 370 according to an embodiment for receiving signals for an integrated circuit. Receiver circuitry 370 may be part of an integrated circuit including one or more of the features of IC 110. For example, receiver circuitry 370 may represent different configuration of receiver circuitry 300, although certain embodiments are not limited in this regard.

In an embodiment, receiver circuitry 370 includes a latch module 310c and a shift module 320c coupled to receive bits B1, B2, B3, B4 variously latched from latch module 310c. Latch module 310c may include latches L1, L2, L3, L4, where inputs 330c for latch module 310c provide signals S4, S1, S3, S2 to latches L1, L2, L3, L4, respectively. Based on signals S4, S1, S3, S2, latches L1, L2, L3, L4 variously latch bits B4, B1, B3, B2, respectively, to shift module 320c.

Receiver circuitry 370 may be configured to implement a pinout 350c in which contact C1 is to serve functionally as logical input R4, contact C2 is to serve functionally as logical input R1, contact C3 is to serve functionally as logical input R3, and contact C4 is to serve functionally as logical input R2.

In an embodiment, S1, S2, S3, S4 are received in parallel and/or concurrently by latch module 310c during such configuration. To facilitate implementation of pinout 350c, latch module 310c may be configured for latches L1, L2, L3, L4 to variously perform latching based on respective delays D1, D2, D3, D4. By way of illustration and not limitation, L1 may be configured with delay D4 to latch bit B4 at time t4. Alternatively or in addition, L2 may be configured with delay D1 to latch bit B1 at time t1, L3 may be configured with delay D3 to latch bit B3 at time t3, and/or L4 may be configured with delay D2 to latch bit B2 at time t2.

In one embodiment, bits B1, B2, B3, B4 are successively latched into, and successively shifted from, the same single bit storage cell of shift module 320c. In another embodiment, some or all of bits B1, B2, B3, B4 are latched into different respective bit storage cells of shift module 320c. Based at least in part on the respective delays D4, D1, D3, D2 configured for latches L1, L2, L3, L4, shift module 320c may be sequentially loaded with and/or sequentially shift out bits B1, B2, B3, B4 in that order. For example, bits B1, B2, B3, B4 may be successively shifted to DS logic (not shown) for operation on bits B1, B2, B3, B4 in a bit order which is consistent with implementing pinout 350c.

Figure 3D:
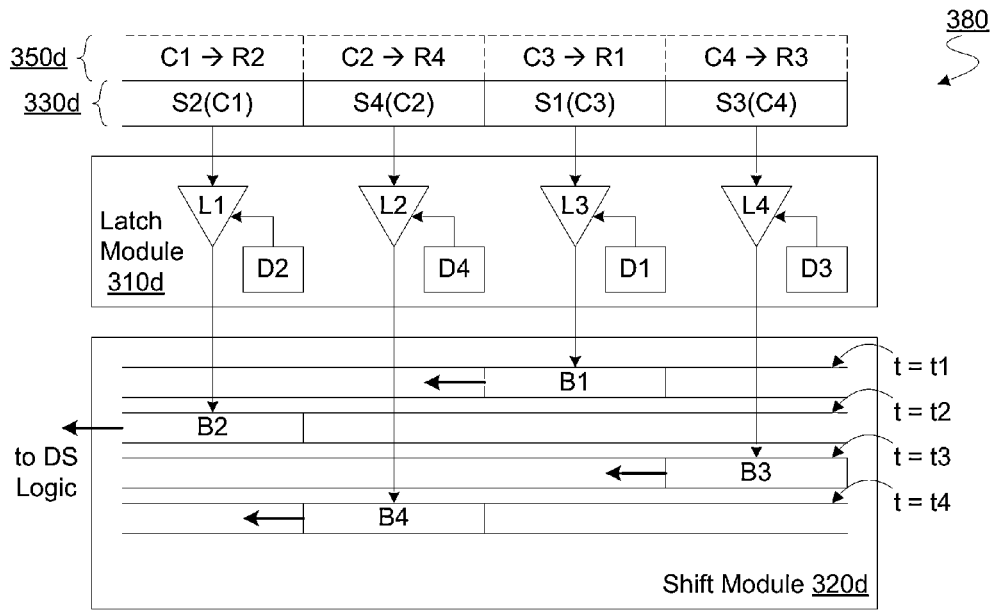

FIG. 3D illustrates elements of receiver circuitry 380 according to an embodiment for receiving signals for an integrated circuit. Receiver circuitry 380 may be part of an integrated circuit including one or more of the features of IC 110. For example, receiver circuitry 380 may represent a different configuration of receiver circuitry 300, although certain embodiments are not limited in this regard.

In an embodiment, receiver circuitry 380 includes a latch module 310d and a shift module 320d coupled to receive bits B1, B2, B3, B4 variously latched from latch module 310d. Latch module 310d may include latches L1, L2, L3, L4, where inputs 330d for latch module 310d provide signals S2, S4, S1, S3 to latches L1, L2, L3, L4, respectively. Based on signals S2, S4, S1, S3, latches L1, L2, L3, L4 variously latch bits B2, B4, B1, B3, respectively, to shift module 320d.

Receiver circuitry 380 may be configured to implement a pinout 350d in which contact C1 is to serve functionally as logical input R2, contact C2 is to serve functionally as logical input R4, contact C3 is to serve functionally as logical input R1, and contact C4 is to serve functionally as logical input R3.

In an embodiment, S1, S2, S3, S4 are received in parallel and/or concurrently by latch module 310d. To facilitate implementation of pinout 350d, latch module 310d may be configured for latches L1, L2, L3, L4 to variously perform latching based on respective delays D1, D2, D3, D4. By way of illustration and not limitation, L1 may be configured with delay D2 to latch bit B2 at time t2. Alternatively or in addition, L2 may be configured with delay D4 to latch bit B4 at time t4, L3 may be configured with delay D1 to latch bit B1 at time t1, and/or L4 may be configured with delay D3 to latch bit B3 at time t3.

In one embodiment, bits B1, B2, B3, B4 are successively latched into, and successively shifted from, the same single bit storage cell of shift module 320d. In another embodiment, some or all of bits B1, B2, B3, B4 are latched into different respective bit storage cells of shift module 320d. Based at least in part on the respective delays D2, D4, D1, D3 configured for latches L1, L2, L3, L4, shift module 320d may be sequentially loaded with and/or sequentially shift out bits B1, B2, B3, B4 in that order. For example, bits B1, B2, B3, B4 may be successively shifted to DS logic (not shown) for operation on bits B1, B2, B3, B4 in a bit order which is consistent with implementing pinout 350d.

Figure 4:
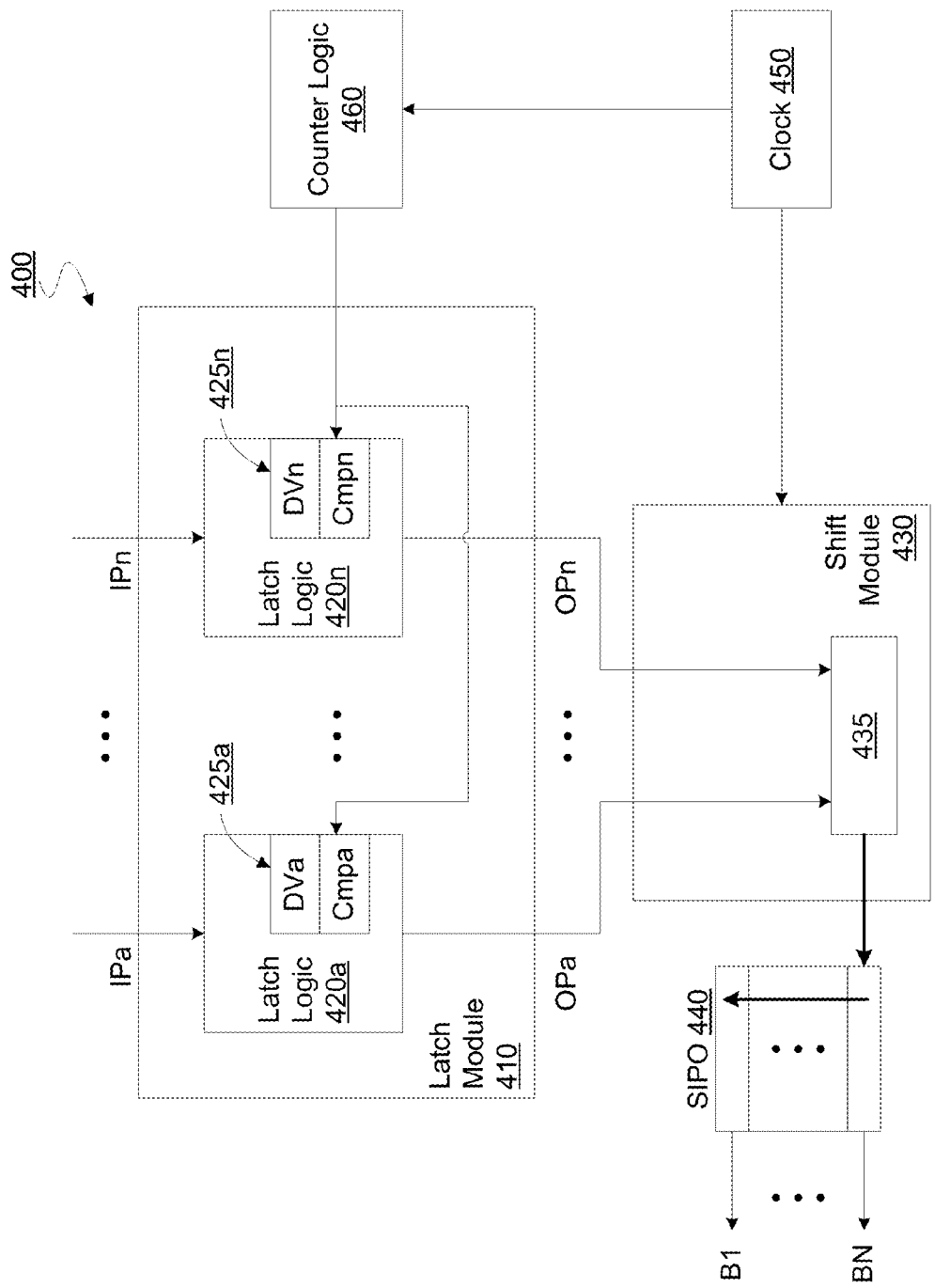
FIG. 4 is a block diagram illustrating elements of receiver circuitry for facilitating a hardware interface pinout according to an embodiment.

FIG. 4 illustrates elements of receiver circuitry 400 according to an embodiment for receiving signals for an integrated circuit. Receiver circuitry 400 may be part of an integrated circuit including one or more of the features of IC 110. For example, receiver circuitry 400 may provide some or all of the functionality of receiver circuitry 300.

Receiver circuitry 400 may include a latch module 410 to receive input signals IPa, . . . , IPn in parallel and/or concurrently and to variously latch output signals OPa, . . . , OPn from latch module 410 based, respectively, on IPa, . . . , IPn. In an embodiment, are IPa, . . . , IPn each received via a different respective contact of hardware interface 140, or other such interface (not shown) for receiver circuitry 400.

Latch module 410 may be configured for a particular order—e.g. including a particular timing—in which OPa, . . . , OPn are to be latched from latch module 410. For example, latch module 410 may include latch logic 420a, . . . , 420n to receive IPa, . . . , IPn, respectively. Latch logic 420a, . . . , 420n may each include, or couple to, respective configuration logic for determining a respective latch timing. By way of illustration and not limitation, a configuration of latch module 410 may include component configurations for respective delay circuits 425a, . . . , 425n of latch logic 420a, . . . , 420n. Such configuration of delay circuits 425a, . . . , 425n may include some or all of the features of the configuration of delay circuits 225a, . . . , 225n, although certain embodiments are not limited in this regard. For example. delay circuits 425a, . . . , 425n may be configured, respectively, for delays DVa, . . . , DVn.

Based on respective delays DVa, . . . , DVn, shift module 430 of receiver circuitry 430 may variously receive OPa, . . . , OPn in an order which facilitates, at least in part, implementation of a particular pinout with a hardware interface for receiver circuit 400. For example, delay circuits 425a, . . . , 425n may include, respectively, comparators Cmpa, . . . , Cpmn each to detect that a corresponding one of delays DVa, . . . , DVn has completed. By way of illustration and not limitation, receipt of IPa, . . . , IPn by receiver circuitry 400 be based on a clock 450. In an embodiment, counter logic 460 of receiver circuitry 400 increments a counter based on clock 450, and variously signals to the respective configuration logic for latch logic 420a, ..., 420n a count status of the counter. Based on signaling from counter logic 460, comparators Cmpa, ..., Cpmn may variously compare or otherwise evaluate the current count status based on a respective one of DVa, ..., DVn to determine whether latching of a respective one of OPa, ..., OPn is to be performed.

In an embodiment, latch module 410 variously latches OPa, ..., OPn—e.g. in an order determine in part by DVa, ..., DVn—each to a storage cell 435 of shift module 430. In another embodiment, some or all of OPa, ..., OPn are latched to different storage cells (not shown) of shift module 430. Latch module 430 may successively shift bits corresponding to OPa, ..., OPn to deserialization logic which is included in, or coupled to, receiver circuitry 400. By way of illustration and not limitation, shift module 430 may shift bits in a sequence B1, ..., BN to a serial-in-parallel-out buffer SIPO 440. In an embodiment, bits B1, ..., BN are buffered in SIPO 440 in an order which facilitates respective processing of bits B1, ..., BN consistent with a particular pinout with the hardware interface (not shown) for receiver circuitry 400.

Figure 5:
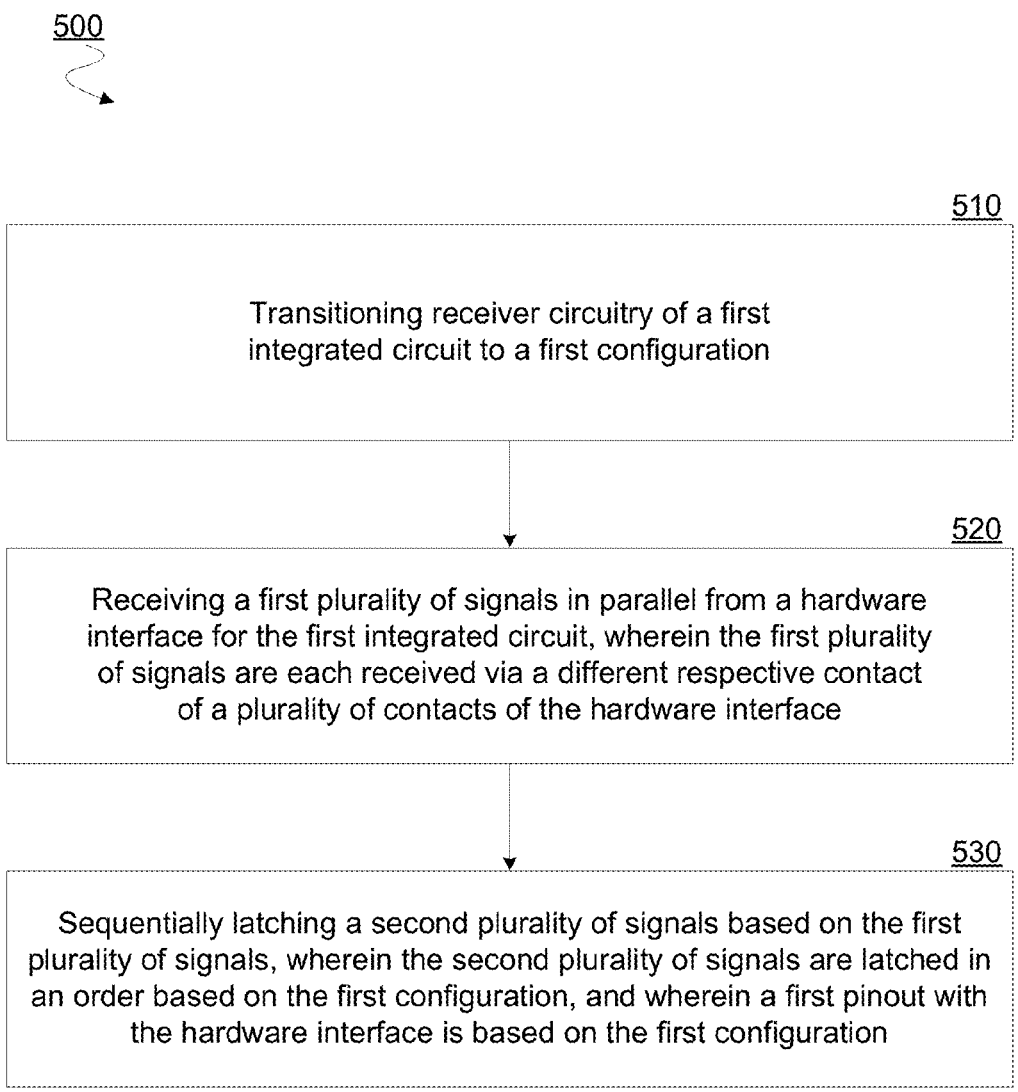
FIG. 5 is a flow diagram illustrating elements of a method for operating an integrated circuit for a hardware interface pinout according to an embodiment.

FIG. 5 illustrates elements of a method for operating an integrated circuit to provide a hardware interface pinout according to an embodiment. Method 500 may be performed with an integrated circuit having some or all of the features of IC 110, for example. In an embodiment, method 500 is performed by receiver circuitry such as receiver circuitry 120.

Method 500 may include, at 510, transitioning receiver circuitry of a first integrated circuit to a first configuration. A hardware interface of the first integrated circuit may include a plurality of contacts, where implementing a first pinout with the hardware interface is based on the first configuration of the receiver circuitry.

By way of illustration and not limitation, the receiver circuitry may include circuitry, such as that of latch module 210, which receives one or more control signals—e.g. from control logic 230. For each of the plurality of contacts of the hardware interface, the one or more control signals may indicate that a respective delay corresponds to the contact. In an embodiment, the transitioning of the receiver circuitry to the first configuration is based on the one or more control signals.

The transitioning at 510 may be in response to communications which are exchanged by the first integrated circuit and a second integrated circuit (or other device) via the hardware interface. In an embodiment, the first integrated circuit and the second integrated circuit are in different IC packages which, for example, are coupled to one another via one or more printed circuit boards. Based on such communications with the second integrated circuit, the first integrated circuit may identify the first pinout and generate the one or more control signals based on the identifying of the first pinout.

For example, the second integrated circuit may send a value which explicitly identifies the first pinout to the first integrated circuit. In another embodiment, the exchange of communications includes the first integrated circuit receiving a sequence of bits each sent via a different respective one of the plurality of contacts. Identification of the first pinout may include the first integrated circuit identifying an order of the plurality of contacts based on the sequence of bits. Based on the identified order of the plurality of contacts, the first integrated circuit may generate the one or more control signals to transition the receiver circuitry to the first configuration.

Method 500 may further include, at 520, the receiver circuitry receiving a first plurality of signals in parallel from the hardware interface. The first plurality of signals—e.g. including the signals IPa, ..., IPn received by receiver circuitry 200—may each be received via a different respective one of the plurality of contacts of the hardware interface.

In an embodiment, method 500 further comprises, at 530, the receiver circuitry sequentially latching a second plurality of signals—e.g. including the signals OPa, ..., OPn output from latch module 210—based on the first plurality of signals. The second plurality of signals may be latched at 530 in an order which is based on the first configuration. For example, the order of such latching may result in respective loading, shifting, buffering and/or other processing of information represented by the first plurality of signals, where such respective loading, shifting, buffering and/or other processing is consistent with hardware interface having the first pinout.

In an embodiment, the sequential latching at 530 variously provides the second plurality of signals to a shift module of the receiver circuitry—e.g. one of shift modules 320a-320d and 430. For each of the plurality of signals, the shift module may variously load and shift a respective bit of data—e.g. where the loaded bits are shifted by the shift module in an order for implementing the first pinout. For example, the shift module may shift the bits to a serial-in-parallel-out (SIPO) buffer or other deserialization logic included in or coupled to the receiver circuitry.

Figure 6:
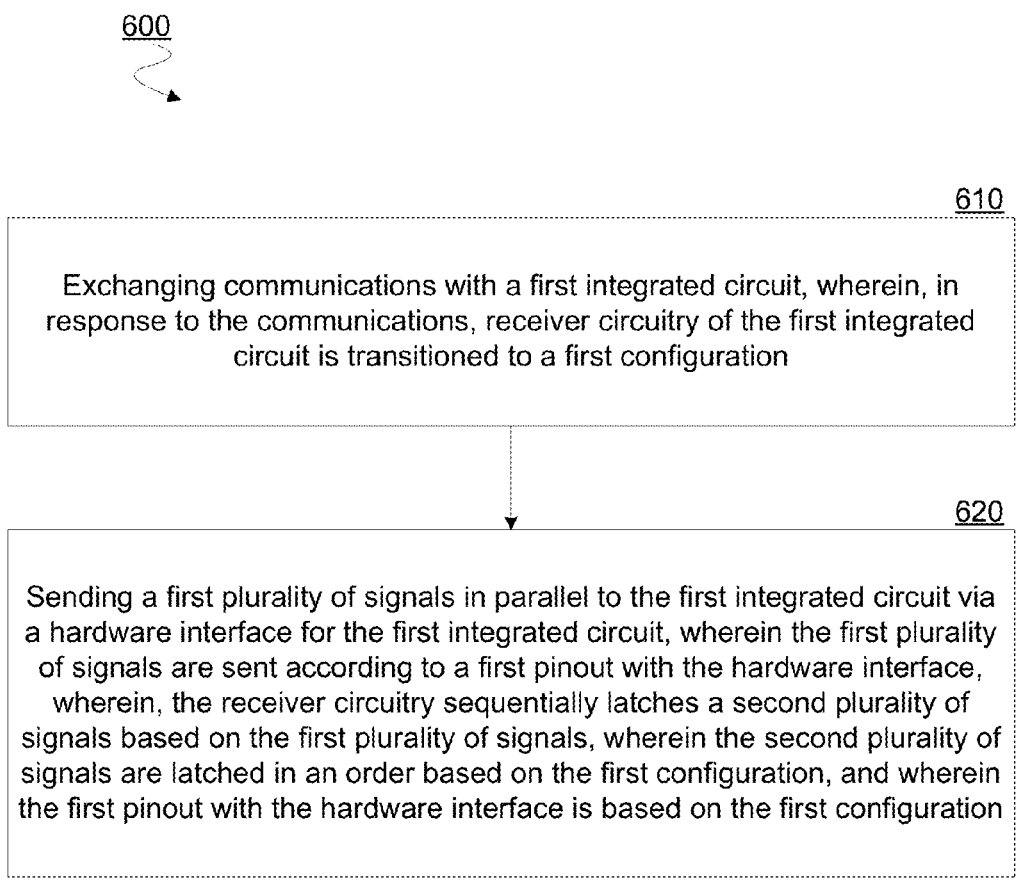
FIG. 6 is a flow diagram illustrating elements of a method for configuring a pinout of a hardware interface according to an embodiment.

FIG. 6 illustrates elements of a method 600 according to an embodiment for configuring an integrated circuit. Method 600 may be performed by a device coupled to IC 110 or other such integrated circuit via a hardware interface for that integrated circuit. For example, method 600 may be performed by communication logic 165 of IC 160.

Method 600 may include, at 610, exchanging communications with a first integrated circuit, wherein, in response to the communications, receiver circuitry of the first integrated circuit is transitioned to a first configuration. For example, in response to the communications exchanged at 610, the first integrated circuit may perform the transitioning at 510 of method 500. The exchanging communications at 610 may include, for example, sending to the first integrated circuit an identifier specifying the first pinout. In another embodiment, the exchanging communications at 610 includes sending a sequence of bits each via a different respective one of a plurality of contacts of the hardware interface. Based on the sequence of bits, the first integrated circuit may identify an order of the plurality of contacts, wherein the receiver circuitry is transitioned to the first configuration based on the identified order of the plurality of contacts.

Method 600 may further comprise, at 620, sending, during the first configuration of the receiver circuitry, a first plurality of signals in parallel via the hardware interface to the first integrated circuit. The first plurality of signals may be sent according to a first pinout with the hardware interface. In an embodiment, the receiver circuitry sequentially latches a second plurality of signals based on the first plurality of signals. By way of illustration and not limitation, in response to the sending of the first plurality of signals at 620, the receiver circuitry may perform the sequential latching at 530 of method 500—e.g. wherein the second plurality of signals are latched in an order based on the first configuration, and wherein the first pinout with the hardware interface is based on the first configuration.

Referring now to FIG. 7, shown is a block diagram of a system 700 in accordance with an embodiment. As shown in FIG. 7, multiprocessor system 700 is a point-to-point (P-P) interconnect system, and includes a first processor 770 and a second processor 780 coupled via a P-P interconnect 750. Each of processors 770 and 780 may be some version of a processor. While shown with two processors 770, 780, it is to be understood that the scope of the present invention is not so limited. In other embodiments, any of a variety of one or more additional or alternative processors may be present in system 700.

Processors 770 and 780 are shown including integrated memory controller units 772 and 782, respectively. Processor 770 may also include as part of its bus controller units P-P interfaces 776 and 778; similarly, second processor 780 includes P-P interfaces 786 and 788. Processors 770, 780 may exchange information via a P-P interface 750 using P-P interface circuits 778, 788. As shown in FIG. 7, IMCs 772 and 782 couple the processors to respective memories, namely a memory 732 and a memory 734, which may be portions of main memory locally attached to the respective processors.

Processors 770, 780 may each exchange information with a chipset 790 via individual P-P interfaces 752, 754 using point to point interface circuits 776, 794, 786, 798. Chipset 790 may also exchange information with a high-performance graphics circuit 738 via an interface circuit 792 along a high-performance graphics interconnect 739. Chipset 790 may be coupled to a first bus 716 via an interface 796. In one embodiment, first bus 716 may be a Peripheral Component Interconnect (PCI) bus, or a bus such as a PCI Express bus or another third generation I/O interconnect bus, although the scope of the present invention is not so limited.

As shown in FIG. 7, various I/O devices 714 may be coupled to first bus 716, and/or a bus bridge 718 may couple first bus 716 to a second bus 720. In one embodiment, second bus 720 includes a low pin count (LPC) bus. Any of various devices may be coupled to second bus 720 including, for example, a keyboard and/or mouse 722, communication devices 727 and a storage unit 728 such as a disk drive or other mass storage device which often includes instructions/code and data 730, in one embodiment. Further, an audio I/O 724 is shown coupled to second bus 720. Note that other architectures are possible, where the included components and interconnect architectures vary. For example, instead of the point-to-point architecture of FIG. 7, a system may implement a multi-drop bus or other such architecture.

System 700 may include a device comprising an integrated circuit and a hardware interface for that integrated circuit. By way of illustration and not limitation, such device may include processor 770, processor 780, a package (not shown) of chipset 790, memory 732, memory 734 and/or any of various other components of system 700. The integrated circuit may include receiver circuitry (such as receiver circuitry 120) to be transitioned to a configuration—e.g. including one of a plurality of possible pinout configurations. In an embodiment, a pinout with the hardware interface is based on the configuration of the receiver circuitry.

In one implementation, an apparatus comprises a hardware interface to exchange a first plurality of signals in parallel, the hardware interface comprising a plurality of contacts each to exchange a respective one of the first plurality of signals. The apparatus further comprises a first integrated circuit to receive the first plurality of signals via the hardware interface, the first integrated circuit including receiver circuitry to transition to a first configuration and further to sequentially latch a second plurality of signals based on the first plurality of signals, wherein the second plurality of signals are latched in an order based on the first configuration, and wherein a first pinout with the hardware interface is based on the first configuration.

In an embodiment, the receiver circuitry includes a latch module to receive one or more control signals, wherein for each of the plurality of contacts, the one or more control signals indicate that a respective delay corresponds to the contact, wherein the receiver circuitry to transition to the first configuration based on the one or more control signals. In another embodiment, the latch module is to operate based on the first configuration, including, for each of the first plurality of signals, the latch module to receive the signal from a respective one of the plurality of contacts, and the latch module to latch a corresponding one of the second plurality of signals based on the signal, wherein the corresponding one of the second plurality of signals is latched based on the delay corresponding to the respective one of the plurality of contacts.

In another embodiment, the receiver circuitry further comprises a shift module to receive the second plurality of signals from the latch module. In another embodiment, the latch module comprises a plurality of latches each coupled to a different respective one of the plurality of contacts, and a plurality of delay circuits each corresponding to a respective one of the plurality of latches, the plurality of delay circuits each to receive a respective counter signal and to trigger a latching of the corresponding one of the plurality of latches based on the respective counter signal.

In another embodiment, the apparatus further comprises control logic to exchange communications with a second integrated circuit coupled to the first integrated circuit via the hardware interface, to identify the first pinout based on the communications and to generate one or more control signals based on identification of the first pinout, wherein the receiver circuitry to transition to the first configuration based on the one or more control signals. In another embodiment, the control logic to exchange communications with the second integrated circuit includes the control logic to receive an identifier specifying the first pinout. In another embodiment, the control logic to exchange communications with the second integrated circuit includes the control logic to receive a sequence of bits each sent via a different respective one of the plurality of contacts, wherein the control logic to identify the first pinout includes the control logic to identify based on the sequence of bits an order of the plurality of contacts, wherein the control logic to generate the one or more control signals based on the order of the plurality of contacts.

In another implementation, a method comprises transitioning receiver circuitry of a first integrated circuit to a first configuration and, with the receiver circuitry, receiving a first plurality of signals in parallel from a hardware interface for the first integrated circuit, wherein the first plurality of signals are each received via a different respective contact of a plurality of contacts of the hardware interface. The method further comprises, with the receiver circuitry, sequentially latching a second plurality of signals based on the first plurality of signals, wherein the second plurality of signals are latched in an order based on the first configuration, and wherein a first pinout with the hardware interface is based on the first configuration.

In an embodiment, the method further comprises receiving one or more control signals with a latch module of the receiver circuitry, wherein for each of the plurality of contacts, the one or more control signals indicate that a respective delay corresponds to the contact, and wherein the transitioning the receiver circuitry to the first configuration is based on the one or more control signals. In another embodiment, the latch module operates based on the first configuration, including, for each of the first plurality of signals, the latch module receiving the signal from a respective one of the plurality of contacts, and the latch module latching a corresponding one of the second plurality of signals based on the signal, wherein the corresponding one of the second plurality of signals is latched based on the delay corresponding to the respective one of the plurality of contacts. In another embodiment, the method further comprises providing the second plurality of signals to a shift module of the receiver circuitry.

In another embodiment, the latch module comprises a plurality of latches each for a different respective one of the plurality of contacts, and a plurality of delay circuits each corresponding to a respective one of the plurality of latches, and the method further comprises a plurality of delay circuits each receiving a respective counter signal and triggering a latching of the corresponding one of the plurality of latches based on the respective counter signal.

In another embodiment, the method further comprises exchanging communications with a second integrated circuit coupled to the first integrated circuit via the hardware interface, identifying the first pinout based on the communications, and generating one or more control signals based on the identifying of the first pinout, wherein the transitioning the receiver circuitry to the first configuration is in response to the one or more control signals.

In another embodiment, the exchanging communications with the second integrated circuit includes receiving from the second integrated circuit an identifier specifying the first pinout. In another embodiment, the exchanging communications with the second integrated circuit includes receiving a sequence of bits each sent via a different respective one of the plurality of contacts, wherein identifying the first pinout includes identifying an order of the plurality of contacts based on the sequence of bits, and wherein the generating the one or more control signals is based on the order of the plurality of contacts.

In another implementation, a system comprises a first device comprising a hardware interface to exchange a first plurality of signals in parallel, the hardware interface comprising a plurality of contacts each to exchange a respective one of the first plurality of signals. The first device further comprises a first integrated circuit to receive the first plurality of signals via the hardware interface, the first integrated circuit including receiver circuitry to transition to a first configuration and further to sequentially latch a second plurality of signals based on the first plurality of signals, wherein the second plurality of signals are latched in an order based on the first configuration, and wherein a first pinout with the hardware interface is based on the first configuration. The system further comprises a second device coupled to the first device, the second device to send the first plurality of signals to the hardware interface.

In an embodiment, the receiver circuitry includes a latch module to receive one or more control signals, wherein for each of the plurality of contacts, the one or more control signals indicate that a respective delay corresponds to the contact, wherein the receiver circuitry to transition to the first configuration based on the one or more control signals. In another embodiment, the latch module is to operate based on the first configuration, including, for each of the first plurality of signals, the latch module to receive the signal from a respective one of the plurality of contacts, and the latch module to latch a corresponding one of the second plurality of signals based on the signal, wherein the corresponding one of the second plurality of signals is latched based on the delay corresponding to the respective one of the plurality of contacts.

In another embodiment, the receiver circuitry further comprises a shift module to receive the second plurality of signals from the latch module. In another embodiment, the latch module comprises a plurality of latches each coupled to a different respective one of the plurality of contacts, and a plurality of delay circuits each corresponding to a respective one of the plurality of latches, the plurality of delay circuits each to receive a respective counter signal and to trigger a latching of the corresponding one of the plurality of latches based on the respective counter signal.

In another embodiment, the first device further comprises control logic to exchange communications with the second device, to identify the first pinout based on the communications and to generate one or more control signals based on identification of the first pinout, wherein the receiver circuitry is to transition to the first configuration based on the one or more control signals. In another embodiment, the control logic to exchange communications with the second device includes the control logic to receive an identifier specifying the first pinout. In another embodiment, the control logic to exchange communications with the second device includes the control logic to receive a sequence of bits each sent via a different respective one of the plurality of contacts, wherein the control logic to identify the first pinout includes the control logic to identify based on the sequence of bits an order of the plurality of contacts, wherein the control logic is to generate the one or more control signals based on the order of the plurality of contacts.

In another implementation, a method comprises exchanging communications with a first integrated circuit, wherein, in response to the communications, receiver circuitry of the first integrated circuit is transitioned to a first configuration. The method further comprises, during the first configuration of the receiver circuitry, sending a first plurality of signals in parallel to the first integrated circuit via a hardware interface for the first integrated circuit, wherein the first plurality of signals are sent according to a first pinout with the hardware interface, wherein, the receiver circuitry sequentially latches a second plurality of signals based on the first plurality of signals, wherein the second plurality of signals are latched in an order based on the first configuration, and wherein the first pinout with the hardware interface is based on the first configuration.

In an embodiment, the exchanging communications with the first integrated circuit includes sending to the first integrated circuit an identifier specifying the first pinout. In another embodiment, the exchanging communications with the first integrated circuit includes sending a sequence of bits each via a different respective one of a plurality of contacts of the hardware interface, wherein the first integrated circuit identifies an order of the plurality of contacts based on the sequence of bits, and wherein the receiver circuitry is transitioned to the first configuration based on the identified order of the plurality of contacts.

Techniques and architectures for providing signal communication are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An apparatus comprising: a first integrated circuit including
a hardware interface to receive a first plurality of signals at least partially in parallel, the hardware interface comprising a plurality of contacts, each to exchange a respective one of the first plurality of signals; and
receiver circuitry to transition to a first configuration and further to sequentially latch a second plurality of signals based on the first plurality of signals in response to the hardware interface to receive the first plurality of signals, wherein the second plurality of signals are to be latched in an order based on the first configuration, and wherein a first pinout with the hardware interface is based on the first configuration, wherein the receiver circuitry includes:
a latch module to receive one or more control signals, wherein for each of the plurality of contacts, the one or more control signals indicate that a respective delay corresponds to the contact, wherein the receiver circuitry to transition to the first configuration based on the one or more control signals.

2. The apparatus of claim 1, wherein the latch module to operate based on the first configuration, including:
for each of the first plurality of signals:
the latch module to receive the signal from a respective one of the plurality of contacts; and
the latch module to latch a corresponding one of the second plurality of signals based on the signal, wherein the corresponding one of the second plurality of signals is latched based on the delay corresponding to the respective one of the plurality of contacts.

3. The apparatus of claim 2, the receiver circuitry further comprising a shift module to receive the second plurality of signals from the latch module.

4. The apparatus of claim 2, wherein the latch module comprises:
a plurality of latches each coupled to a different respective one of the plurality of contacts; and
a plurality of delay circuits each corresponding to a respective one of the plurality of latches, the plurality of delay circuits each to receive a respective counter signal and to trigger a latching of the corresponding one of the plurality of latches based on the respective counter signal.

5. The apparatus of claim 1, wherein the apparatus further comprises control logic to exchange communications with a second integrated circuit coupled to the first integrated circuit via the hardware interface, to identify the first pinout based on the communications and to generate one or more control signals based on identification of the first pinout, wherein the receiver circuitry to transition to the first configuration based on the one or more control signals.

6. The apparatus of claim 5, wherein the control logic to exchange communications with the second integrated circuit includes the control logic to receive an identifier specifying the first pinout.

7. The apparatus of claim 5, wherein the control logic to exchange communications with the second integrated circuit includes the control logic to receive a sequence of bits each sent via a different respective one of the plurality of contacts, wherein the control logic to identify the first pinout includes the control logic to identify based on the sequence of bits an order of the plurality of contacts, wherein the control logic to generate the one or more control signals based on the order of the plurality of contacts.

8. A method comprising:
transitioning receiver circuitry of a first integrated circuit to a first configuration;
with the receiver circuitry, receiving a first plurality of signals in parallel from a hardware interface for the first integrated circuit, wherein the first plurality of signals are each received via a different respective contact of a plurality of contacts of the hardware interface;
with the receiver circuitry, sequentially latching a second plurality of signals based on the first plurality of signals, wherein the second plurality of signals are latched in an order based on the first configuration, and wherein a first pinout with the hardware interface is based on the first configuration; and receiving one or more control signals with a latch module of the receiver circuitry, wherein for each of the plurality of contacts, the one or more control signals indicate that a respective delay corresponds to the contact, and wherein the transitioning the receiver circuitry to the first configuration is based on the one or more control signals.

9. The method of claim 8, wherein the latch module operates based on the first configuration, including:
for each of the first plurality of signals:
the latch module receiving the signal from a respective one of the plurality of contacts; and
the latch module latching a corresponding one of the second plurality of signals based on the signal, wherein the corresponding one of the second plurality of signals is latched based on the delay corresponding to the respective one of the plurality of contacts.

10. The method of claim 9, further comprising providing the second plurality of signals to a shift module of the receiver circuitry.

11. The method of claim 9, wherein the latch module comprises a plurality of latches each for a different respective one of the plurality of contacts, and a plurality of delay circuits each corresponding to a respective one of the plurality of latches, the method further comprising:
a plurality of delay circuits each receiving a respective counter signal and triggering a latching of the corresponding one of the plurality of latches based on the respective counter signal.

12. The method of claim 8, further comprising:
exchanging communications with a second integrated circuit coupled to the first integrated circuit via the hardware interface; and
identifying the first pinout based on the communications; and
generating one or more control signals based on the identifying of the first pinout, wherein the transitioning the receiver circuitry to the first configuration is in response to the one or more control signals.

13. The method of claim 12, wherein the exchanging communications with the second integrated circuit includes receiving from the second integrated circuit an identifier specifying the first pinout.

14. The method of claim 12, wherein the exchanging communications with the second integrated circuit includes receiving a sequence of bits each sent via a different respective one of the plurality of contacts, wherein identifying the first pinout includes identifying an order of the plurality of contacts based on the sequence of bits, and wherein the generating the one or more control signals is based on the order of the plurality of contacts.

15. A system comprising:
a first device comprising:
a hardware interface to exchange a first plurality of signals in parallel, the hardware interface comprising a plurality of contacts each to exchange a respective one of the first plurality of signals;
a first integrated circuit to receive the first plurality of signals via the hardware interface, the first integrated circuit including receiver circuitry to transition to a first configuration and further to sequentially latch a second plurality of signals based on the first plurality of signals, wherein the second plurality of signals are latched in an order based on the first configuration, and wherein a first pinout with the hardware interface is based on the first configuration, wherein the receiver circuitry includes:
a latch module to receive one or more control signals, wherein for each of the plurality of contacts, the one or more control signals indicate that a respective delay corresponds to the contact, wherein the receiver circuitry to transition to the first configuration based on the one or more control signals; and
a second device coupled to the first device, the second device to send the first plurality of signals to the hardware interface.

16. The system of claim 15, wherein the latch module to operate based on the first configuration, including:
for each of the first plurality of signals:
the latch module to receive the signal from a respective one of the plurality of contacts; and
the latch module to latch a corresponding one of the second plurality of signals based on the signal, wherein the corresponding one of the second plurality of signals is latched based on the delay corresponding to the respective one of the plurality of contacts.

17. The system of claim 16, the receiver circuitry further comprising a shift module to receive the second plurality of signals from the latch module.

18. The system of claim 16, wherein the latch module comprises:
a plurality of latches each coupled to a different respective one of the plurality of contacts;
a plurality of delay circuits each corresponding to a respective one of the plurality of latches, the plurality of delay circuits each to receive a respective counter signal and to trigger a latching of the corresponding one of the plurality of latches based on the respective counter signal.

19. The system of claim 15, wherein the first device further comprises control logic to exchange communications with the second device, to identify the first pinout based on the communications and to generate one or more control signals based on identification of the first pinout, wherein the receiver circuitry to transition to the first configuration based on the one or more control signals.

20. The system of claim 19, wherein the control logic to exchange communications with the second device includes the control logic to receive an identifier specifying the first pinout.

21. The system of claim 19, wherein the control logic to exchange communications with the second device includes the control logic to receive a sequence of bits each sent via a different respective one of the plurality of contacts, wherein the control logic to identify the first pinout includes the control logic to identify based on the sequence of bits an order of the plurality of contacts, wherein the control logic to generate the one or more control signals based on the order of the plurality of contacts.

22. A method comprising:
exchanging communications with a first integrated circuit, including sending to the first integrated circuit an identifier specifying a first pinout, wherein, in response to the communications, receiver circuitry of the first integrated circuit is transitioned to a first configuration; and
during the first configuration of the receiver circuitry, sending a first plurality of signals in parallel to the first integrated circuit via a hardware interface for the first integrated circuit, wherein the first plurality of signals are sent according to the first pinout with the hardware interface, wherein, the receiver circuitry sequentially latches a second plurality of signals based on the first plurality of signals, wherein the second plurality of signals are latched in an order based on the first configuration, and wherein the first pinout with the hardware interface is based on the first configuration.

23. The method of claim 22, wherein the exchanging communications with the first integrated circuit includes sending a sequence of bits each via a different respective one of a plurality of contacts of the hardware interface, wherein the first integrated circuit identifies an order of the plurality of contacts based on the sequence of bits, and wherein the receiver circuitry is transitioned to the first configuration based on the identified order of the plurality of contacts.

\* \* \* \* \*